US006169685B1

(12) United States Patent
Gandini et al.

(10) Patent No.: US 6,169,685 B1
(45) Date of Patent: Jan. 2, 2001

(54) CONTENT ADDRESSABLE MEMORIES

(75) Inventors: Marco Gandini; Alessandro Torielli, both of Turin; Maura Turolla, Almese, all of (IT)

(73) Assignee: Cselt-Centro Studi e Laboratori Telecomuicazioni S.p.A., Turin (IT)

( * ) Notice: Under 35 U.S.C. 154(b), the term of this patent shall be extended for 0 days.

(21) Appl. No.: 09/570,149

(22) Filed: May 12, 2000

(30) Foreign Application Priority Data

May 17, 1999 (IT) .................................................. TO99A0411

(51) Int. Cl.[7] .................................................. G11C 15/00
(52) U.S. Cl. .................................. 365/49; 365/189.07
(58) Field of Search ........................... 365/49, 189.07

(56) References Cited

U.S. PATENT DOCUMENTS

| | | | | |
|---|---|---|---|---|
| 5,107,501 | * | 4/1992 | Zorian | 365/49 |
| 5,130,947 | * | 7/1992 | Reed | 365/49 |
| 5,226,005 | * | 7/1993 | Lee et al. | 365/49 |

* cited by examiner

*Primary Examiner*—Son T. Dinh
*Assistant Examiner*—Tuan T. Nguyen
(74) *Attorney, Agent, or Firm*—Herbert Dubno

(57) ABSTRACT

A CAM memory is supplied targeted at storing data words whose bits can take on an indifferent logical value besides two complementary logical values. it includes a matrix (MA) of memory cells in which a pair of cells is assigned to each bit that can take on a ternary configuration. circuits (CT1 . . . CT3, WR, SR; CT11 . . . SR1, CT21 . . . SR2) for memory (MA) matrix access control give access for performing comparisons during operation in the CAM mode or for writing/reading data by means of direct RAM mode addressing (FIG. 1).

8 Claims, 4 Drawing Sheets

CONTENT ADDRESSABLE MEMORIES

This invention relates to the memory devices produced as an integrated circuit and more particularly a content addressable, or associative memory.

These memories are generally referred to by the acronym CAM from the initial letters of the words "Content(s) Addressable Memory" and will be referred to as such in the description that follows.

BACKGROUND OF THE INVENTION

CAM memories are currently used in many applications requiring search inside a database. Briefly, a CAM memory includes a matrix of memory cells each storing one data word bit and is associated with a comparator. The memory receives the data (comparand) to be searched from a user device and the comparator performs a bit-to-bit comparison between the comparand and the words stored. In the event of a positive match (that is to say the item searched is actually found to be present in the memory), the user device is given the address where the item is stored, together with any additional data present. In many applications, the information read from the memory is later used for direct access to a second memory structure. A feature of these memories is that they compare input data with all the items they contain in one clock signal cycle, and make the search potentially faster than with conventional random access memories that would require several comparison cycles.

One CAM application that is becoming increasingly interesting for telecommunications is the creation of routing tables inside high speed web nodes, such as ATM, Internet and like nodes, in which where packages with headers containing package destination data are transmitted. At message receipt, web node routing management tools use all or part of this address to search a table and retrieve the output interface to which the package is to be forwarded for transmission to a subsequent web body.

In the literature several commercially available CAM memories are described, such as in U.S. Pat. Nos. 5,383,146, 5,469,378, 5,495,382, 5,841,874. Among the memories, it is known the MUSIC Semiconductors Inc. component, named MU9C2480A LANCAM®.

All these devices are produced as autonomous integrated circuits separate from any memory user device integrated circuit.

Today's more advanced technical solutions are oriented at manufacturing complex equipment such as Internet or ATM node routers on one integrated circuit. Given this trend, it would be advisable for the CAM memory too to be incorporated into the same integrated circuit containing the user device to prevent access to external memories. This makes device operations faster, simplifies its overall structure by eliminating pins and connections and reduces overall consumption.

Incorporating the CAM memory into the same circuit containing the user device as well therefore imposes constraints to the physical dimensions of the memory and thus its capacity. Possible greater exploitation of storage capacity is offered by ternary memories where word bits can have an indifferent (don't care) logical value besides the logical values of 0, 1. Assigning an indifferent logical value to word bit groups permits the reduction of the number of words to be actually stored. U.S. Pat. No. 5,841,874 describes an example of ternary CAM memory.

Another issue to be borne in mind is that an item read in a CAM memory is often an address or an access pointer to a further RAM or direct access type data structure. The interest in having the same integrated circuit contain both the data structure to be used as a CAM search memory and the RAM structure is obvious. U.S. Pat. No. 5,383,146, also used in the MU9C2480A LANCAM® component mentioned above, describes a CAM memory programmable so as to disable comparators associated to bit groups of each word stored and have part of each word characterised as CAM and the remaining part as RAM. The option of operating as a ternary memory is not provided, nor the possibility of incorporating the memory into the same integrated circuit the user device is made of. Furthermore, programmability concerns bit groups totalling no less than a certain number (groups of 8 bits particularly). U.S. Pat. No. 5,841,874 mentioned above describes the possibility of associating a ternary memory with a RAM memory addressable by signals obtained as the result of CAM search on the same integrated circuit, but the memory area useable as RAM contains data separate from those stored in CAM.

The purpose of this invention is to supply a ternary CAM memory designable as an integrated circuit library cell capable of being incorporated into a user device. Special attention must be given to memory power consumption in these conditions and the memory described in the invention presents interesting solutions from this standpoint.

Another advantageous feature of the invention is that the memory is such that it is possible to configure fractions useable as ternary CAM, binary CAM or RAM, according to need.

SUMMARY OF THE INVENTION

The memory of the invention includes:

at least one memory cell matrix organized to form an array of M data words of N bits each, where each bit is stored in one cell;

means for presenting to the matrix or matrices a data word to search in the memory by comparing it with a mask word, such presentation means being connected to the matrix cells by lines for bits shared by all the cells of one column;

comparison means associated with each cell for comparison between a comparand bit and the bit stored in the cell, the outputs of such comparison means associated to the cells of each line being combined with one another to generate positive or negative outcome signals of the comparison completed in the line cells;

encoding means connected to the match lines and able to emit signals indicating whether or not matches were found between the comparand and stored words, and in the affirmative, whether a match was found with one or more words stored; and means for checking access to the matrix for execution of a search or for writing/reading data by direct addressing.

and is characterised by the fact that According to the invention the entire array of words stored in the memory matrix is a data structure accessible by direct addressing, the address being supplied by a user device or consisting of the signal emitted by encoding means to indicate that a match was found between the comparand and one word stored.

The memory matrix contains a supplementary line of cells, allocated to storing dummy data and organized so that comparison with a comparand always gives a positive comparison signal on a dummy match line, and a supplementary column of cells not allocated to memory data and containing a cell corresponding to said supplementary line. The encoding means contains a supplementary section connected to the supplementary memory matrix line outputting a dummy address signal.

During direct address memory operation, the control means can always address said supplementary line too.

The memory matrix supplementary line with the supplementary section of the encoding means, and a first control means unit form an initial resetting loop used during memory operation to execute comparisons between a comparand and the data stored to check said first control means unit in such as way as to disable said presentation means as soon as a comparand and its mask are presented to the memory matrix. The supplementary line and column create a resetting signal together with the generation unit. The control means is part of a second resetting loop used during memory operation to control the control means in such a way as to disable data addressing and reading means as soon as data have been read.

BRIEF DESCRIPTION OF THE DRAWINGS

For further clarification, reference is made to the drawing, where.

SPECIFIC DESCRIPTION

Figure 1:
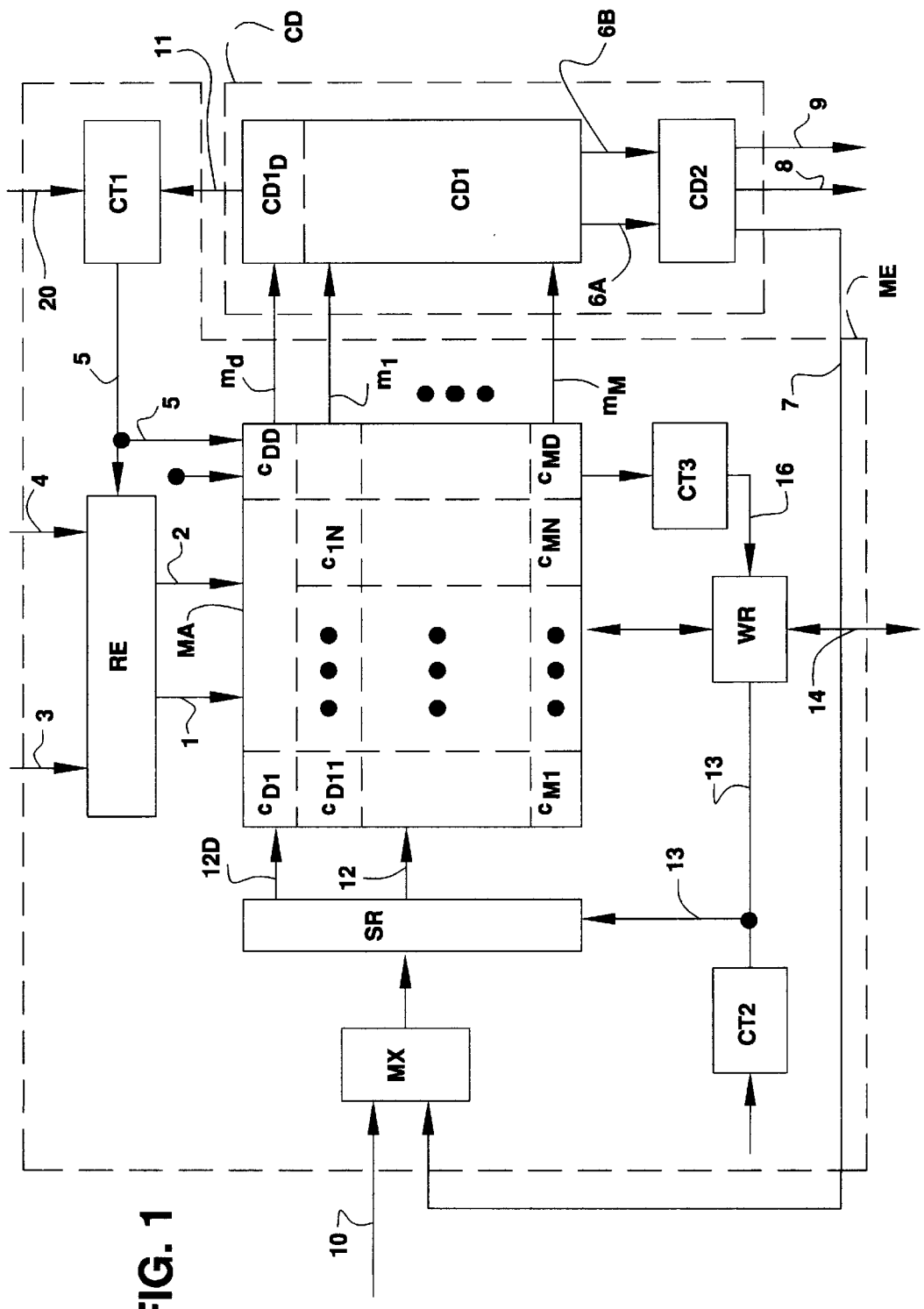
FIG. 1 is a general block diagram of a CAM memory described by the invention.

FIG. 1 shows the structure of a CAM memory also suitable for use as RAM. The memory includes:

an MA memory matrix with M lines and N columns;

a pair of registers shown by block RE to present the MA matrix respectively with the item to be searched in the memory (the comparand) and the comparand masking bits (the mask). The latter are bi-univocally associated to the comparand bits and their logical values indicate whether the related comparand bit has to be compared with an item bit or not (comparand indifference conditions)

a CD encoder to output the address at which a retrieved item is to be stored in MA (if a match between comparand and item was only found for one stored word) or the indication of a multiple match or mismatch;

an SR circuit for selecting the line involved in a RAM mode access operation;

a logical WR network for writing cell contents during a memory creation or correction phase and for reading them during RAM mode operation;

CT1, CT2 and CT3 circuits for generating memory operation control signals during RAM or CAM mode operation.

The above-mentioned blocks, excepting the CD encoder, make up an elementary ME module, which can be replicated on the component destined to house the user device so as to obtain a memory with the capacity required by the application.

Each matrix MA cell $C_{11} \ldots C_{1N} \ldots C_{M1} \ldots C_{MN}$ contains the real and proper memory element and a comparator to compare the bit stored inside it with a comparand bit supplied by the RE register through a line commonly known as a bit line. Comparator outputs of the cells on the same line are connected with logical AND to output on an $m_1 \ldots m_m$ line commonly known as a match line whether or not the bit to bit comparison between the word stored in the line and a comparand is positive. As is usual with these types of memories, the MA matrix is a static RAM memory in which each cell stores both the item bit real and proper and the complementary bit, so each cell is actually connected to two bit lines, so as to present the comparand bit both with its actual logic values and its complementary value. This means that each comparand register position presents a straight and a denied output. Connection 1 between RE and MA gives the diagram for all pairs of wires leading the comparand and its complement to the matrix.

An example of the functional structure of a cell and the organisation of the matrix is shown for instance in U.S. Pat. No. 5,383,146. A possible circuit diagram is described in U.S. Pat. No. 5,469,378.

As an example, the following will refer when necessary to an MA matrix with a 256 40-bit capacity.

The content of matrix MA is also a data structure accessed by direct addressing during operation as a RAM memory. As will be seen better later on, the RAM access address can consist of the information supplied as CD encoder output. This is especially advantageous for applications such as the completion of search tables in Internet web routing management devices, where search is often only made on the prefix of a bit string.

Line cells are preferably connected to one another by domino logic. In other terms, recognition of a comparison result is on groups of cells, each associated to a preload and assessment transistor. Outputs from the assessment transistor of the various groups are then combined to form match line m. Preload and assessment enabling signals are presented by RE to the groups of cells involved by lines indicated with 2 on the complex. In an example, where recognition of comparison results is done by groups of eight cells, there will be a line 2 every eight pairs of lines 1.

The memory described by the invention is a ternary CAM memory, where each bit stored in MA can be 0, 1 or don't care. In a ternary CAM memory, comparison between the input item bits and the memory bits located at the don't care level is obviously always positive. Two cells must be allocated to use the memory as a ternary CAM memory for each stored word bit that can have a don't care value. Consequently, with reference to the numerical example given above, memory words will have a significant number of bits ranging from 20 to 40, subject to how many stored bits have a ternary configuration. Logical levels 0, 1 and don't care are preferably stored in MA as 01, 10 and 00 respectively. Cells to be used for ternary storing are preferably chosen in advance, based on the design of the system the memory is used in and specific application requirements, so WR writing-reading logic will receive data where bits to be stored as ternary have already been encoded as specified above. In other terms, the number of bits that can have a binary or ternary configuration becomes one of the project parameters; in particular, user configuration reaches the level of an individual bit. Conversion into a pair of bits will be performed to take account of ternary bits, including the corresponding comparand one. In particular, by indicating with an "x" the don't care logical value, the following conversion law can be adopted for the comparand bit: 0 bits are converted into "0x", 1 bits into "x0" and x bits into "xx".

In addition to the cells for containing data, the MA matrix also has another dummy line and column whose cells are indicated with $C_{D1} \ldots C_{DD} \ldots C_{MD}$. The purpose of this line and column will be described in detail further on. The dummy line is associated to a match line $m_D$ and is organized to always generate a match.

Each RE register consists of one element for each MA matrix column for data (therefore 40 elements). Each element receives the comparand or mask from the user device and the necessary timing signal for loading the comparand and mask on the 1 line to MA and their presentation from the CT1 circuits. 3, 4 and 5 indicate all the lines for leading the comparand, mask and command lines to RE. When at 1, the mask bit forces the same logical value on the two 1 lines from their element to always make a match on that column, whatever the logical value of the item bit stored in the corresponding MA cell. This achieves the don't care condition for a comparand bit. The number and position of the don't care logical value bit is a design parameter too.

In particular, memory and user device configuration can be made to be such that an entire string of comparand bits is forced into the don't care condition. This is equivalent to considering the corresponding part of the MA matrix as a RAM memory and using only the remaining part as a CAM memory. This configuration is particularly useful when associating additional information to be accessed simultaneously to the information searched during CAM mode operation.

The CT1 block receives clock and component selection signals as well as signals identifying time windows for loading the comparand and the mask into register RE from outside and transforms them into commands on connection 5. Some of these commands will be dealt with later on, CT1 also receives a resetting signal from the CD encoder through a 11 connection for the purposes illustrated further on.

The output CD encoder consists of two parts. The first part CD1 is the code logic real and proper and supplies two groups of bits whose configuration varies according to whether the result of comparand and data comparison is one match, multiple matches or a mismatch, on a pair of 6A 6B outputs. In particular, if the match is only for one line of the MA matrix, CD1 supplies on output 6A a configuration representing the identity of the m match line involved (in practice the encoding for the corresponding MA matrix line address) and the complementary configuration on output 6B. In case of multiple matches, CD1 issues configurations that are not complementary to one another on outputs 6A and 6B, while in case of negative comparison for all CD1 lines two values will be issued whose bits have the same logical value (1 in particular).

The second part CD2 is a comparator that compares bit to bit all the values issued on the two CD1 outputs, 6A and 6B, and issues the corresponding address on output 7 in case of a match on one m line only for possible use as an MA address in a subsequent cycle where the memory is used as RAM; CD2 issues signals on two other outputs, 8, 9, in case of multiple matches or a mismatch.

The encoder section CD1 can in practice consist of a double matrix with M lines, each connected to one of the match lines from MA and $2\log_2 M$ columns ($\log_2 M$ columns for each matrix section, that is to say as many columns as the bits required to code an MA matrix line address). Columns are preloaded at a tension corresponding to the logical value of 1, and transistors connected to ground (logical 0) the respective column are located at the intersections of selected lines and columns when the match signal is present on the line. There is no connection between columns and lines at other intersections. The logical value corresponding to the tension present on each column is a 6A or 6B CD1 output bit. The intersections at which transistors are to be located are selected so that output bit configuration in the presence of the match signal on the corresponding line considered independently of the other lines represents the line address or its complement, for the first and second matrix section respectively.

Figure 2:
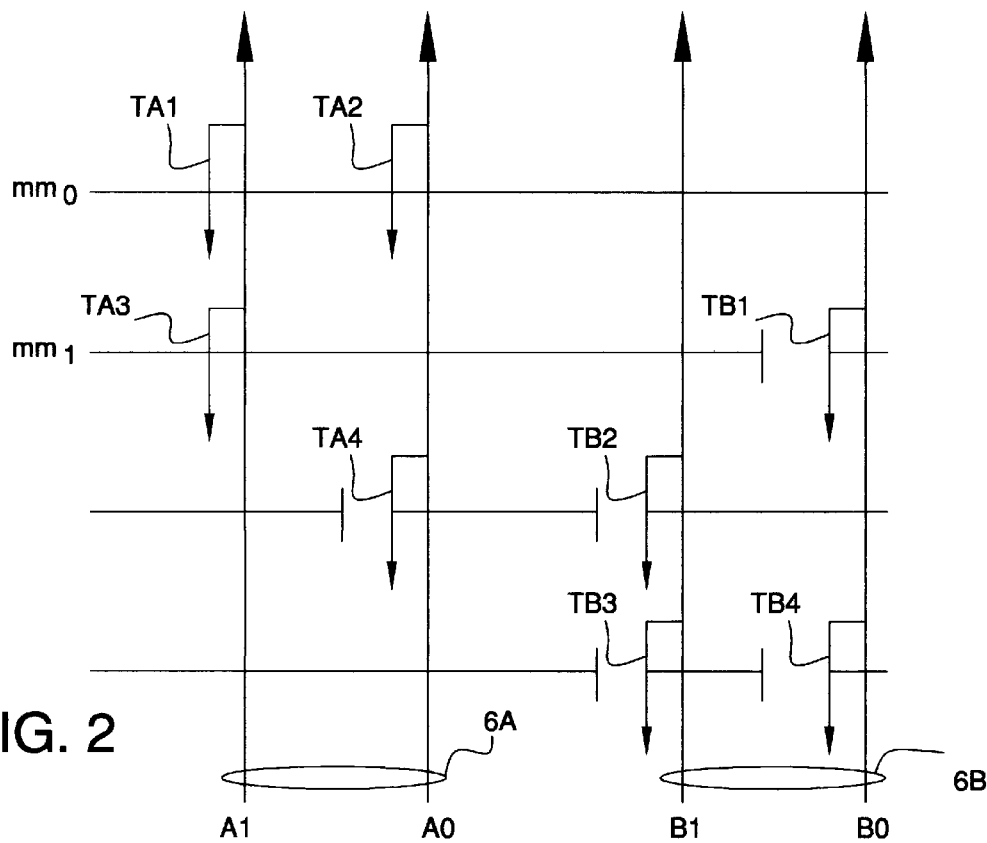
FIG. 2 is a simplified diagram of the decoder.

FIG. 2 shows the diagram of the location adopted in the CD1 encoding logic, considering an extremely simplified matrix of only four lines connected to match lines marked $mm_0 \ldots mm_4$. Each double matrix section consequently contains two A0, A1 and B0, B1 columns (the columns with the same numerical index being columns in homologous positions), that respectively form outputs 6A, 6B. A0 and B0 are the columns giving the least significant bit as an output. TA1 . . . TA4 and TB1 . . . TB4 are the transistors in the two matrix parts respectively.

It is obvious that the arrangement of transistors TA, TB is actually such that in the presence of a logical 1 on one mm line gives the line address as an output (respectively 00, 10, 01, 11 following the layout of the figure with the least significant bit to the right) and complement of columns B (11, 01, 10, 00). If however, in case of a 1 on more than one mm line, on the first and second $mm_0$, $mm_1$ line for instance, columns A present configuration 00 and columns B configuration 10, other than the complement of the configuration present on columns A. When no 1 is present on any line, configuration 11 is present on outputs A and B. Extension to the actual case of m lines and $\log_2 M$ columns is immediate.

The first encoder section CD1 will also contain a dummy $CD1_0$ part to account for the existence of the dummy line. It always receives a match signal and always transmits a signal interpretable as a dummy address on output 11. In practice, this requires the double matrix to present another line corresponding to the matrix dummy line and disconnected from the corresponding columns at outputs 6A, 6B.

The SR line selection circuit can select a line of matrix MA either based on an address supplied from the outside through a 10 connection or based on the address present on connection 7, as shown by multiplexer MX. Address mode selection is controlled from the outside. Whenever the memory operates as RAM, the SR circuit always causes addressing of both of the specific and the dummy line, as shown by the two 12, 12D outputs.

CT2 control circuits receive conventional clock signals (generally the same as supplied to CT1), component selection and read/write signals from the outside and generate the conventional command signals required for operating a RAM memory besides a GO signal supplied both to the SR circuit and the WR logic line. These signals are present on the wires of a 13 connection. Some of these signals will be dealt with later.

The WR logic network for writing data in MA and outside delivery of data read in MA consists of the same number of units as the MA columns actually allocated to data (40 in the example described). 14, 15 indicate the data input-output connections for data respectively from/to the outside of module ME and from/to matrix MA. Each WR unit has a conventional structure and includes in the writing direction sample circuits of the signals to be written, circuits for column preload and buffers to carry the signals to be written to the level required by the memory cell circuit. In the read direction, WR includes the sense amplifier and circuits for properly timing the read signal output.

The WR logic network also receives another resetting signal through wire 16 from a CT3 logic connected to the MA dummy column. The purpose of this second signal will be dealt with further on.

Figure 3A:
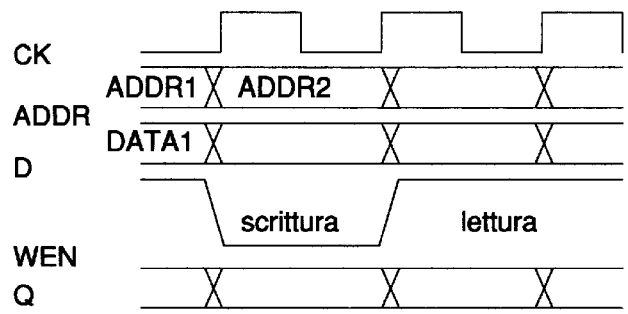
FIGS. 3A–3D are some operation time diagrams.
Figure 3B:
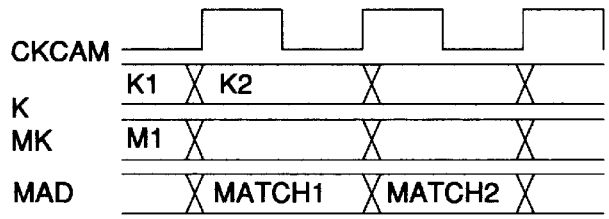

General memory operation as RAM and CAM is illustrated in the diagrams of FIGS. 3A, 3B, where CK, CKCAM are the clock signals for RAM and CAM operation (generally identical), lines ADDR, D, Q, WEN respectively indicate address and data loading, data reading and read/write commands for operation as RAM; K, MK, MAD respectively represent comparand and mask and retrieved item address emission loading steps. The write step shown in the figure relates to DATA1 and address ADDR1; the read step relates to the item stored at address ADDR2. The diagrams are quite clear for a technician and require no further explanation.

Returning to the MA dummy column and line, the dummy line cells are not connected to lines for bits output from register RE and store a preset logical value bit. They are connected to an $m_D$ match line the same way as the actual data line cells. In these conditions, they will always supply a match signal on $m_D$. The dummy column cells are connected to a preset logical value (and its complement) through lines similar to those for operating cell bits, and the cell corresponding to the dummy cell is also connected to the match line for that line. The dummy column and line are used jointly during memory RAM operation while the dummy line (the cell corresponding to the dummy column particularly) is used by itself during memory CAM operation. Their main purpose is to reduce consumption while maintaining address and detection circuits (those with actual higher consumption) active only for the minimum time required.

Figure 3C:
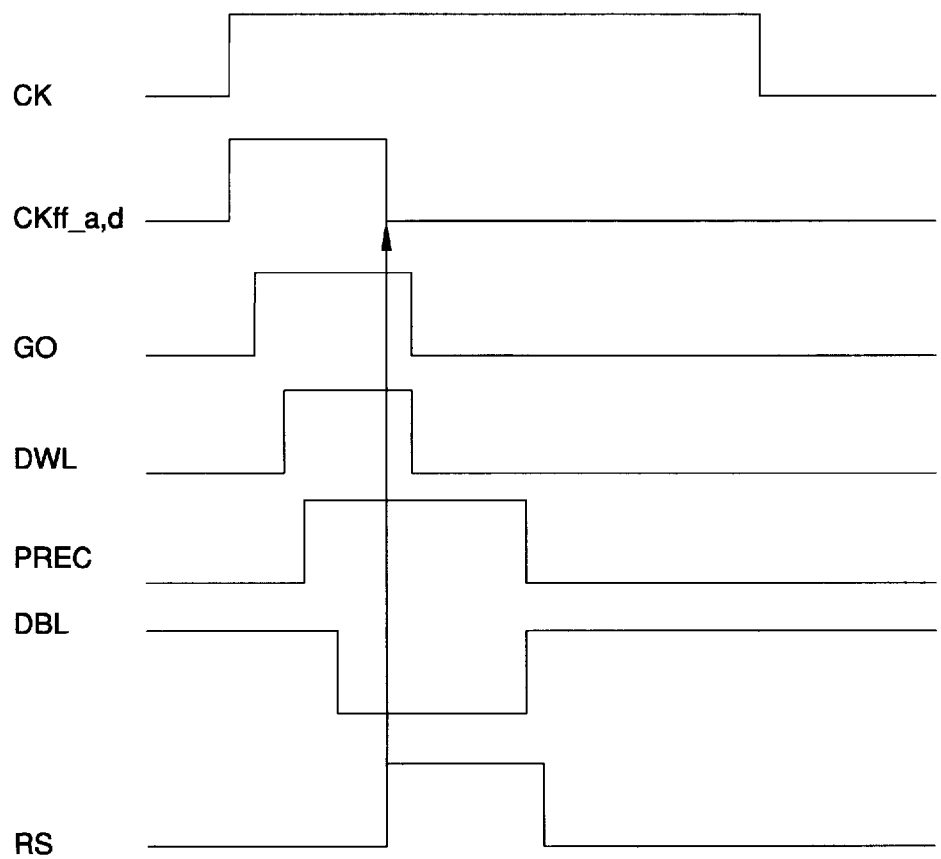

Operation of the dummy column and line when the memory is used in the RAM mode is illustrated in the time diagram of FIG. 3C. The rise of a CK clock signal entering CT2 generates rise of signals CKff_a and CKff_d that are sent to SR and WR for address and data loading respectively (Cf. also FIG. 3A), GO that enables the line selected and DWL that enables the dummy line. Column preloading is disabled (passage of signal PREC to 1) and the dummy column read (passage of signal DBL to 0). The passage of DBL to 0 causes resetting signal RS in CT3 (Cf. FIG. 1), which switches off read amplifiers in WR and returns to original conditions. All signals generated last as long as strictly necessary to guarantee operation independently of CK duty-cycle and period.

Figure 3D:
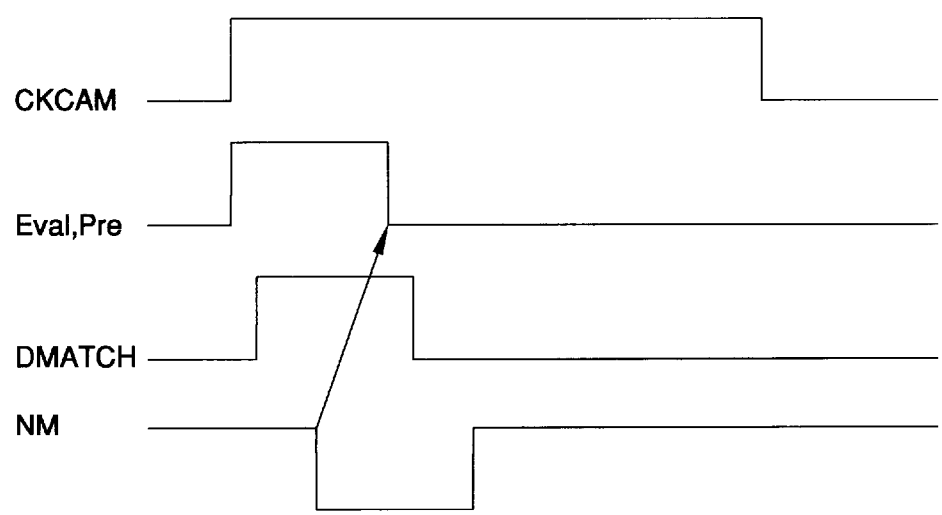

In CAM operation (Cf. FIG. 3D), whenever a comparand presents to the memory, a match signal is obtained on the match line associated to the MA matrix dummy line, which is sent to the encoder dummy part by generating the dummy address on line 11, which in its turn causes CT1 to disable RE. More specifically, CKCAM clock rise causes the mask and comparand to load (Cf. also FIG. 3B) and originates rise of result assessment and reading signals Eval and Pre when the mask and comparand are stable. The AND of positive comparison result bits forced into the dummy lines originates DMATCH rise on match line $m_D$. The CD encoder $CD1_D$ dummy part generates a dummy code address NM on output 11, which interrupts comparison and returns the system to its original state. In this case too, the advantage is that all pulses generated last as long as strictly necessary to guarantee operation independently of CKCAM duty-cycle and period.

Figure 4:
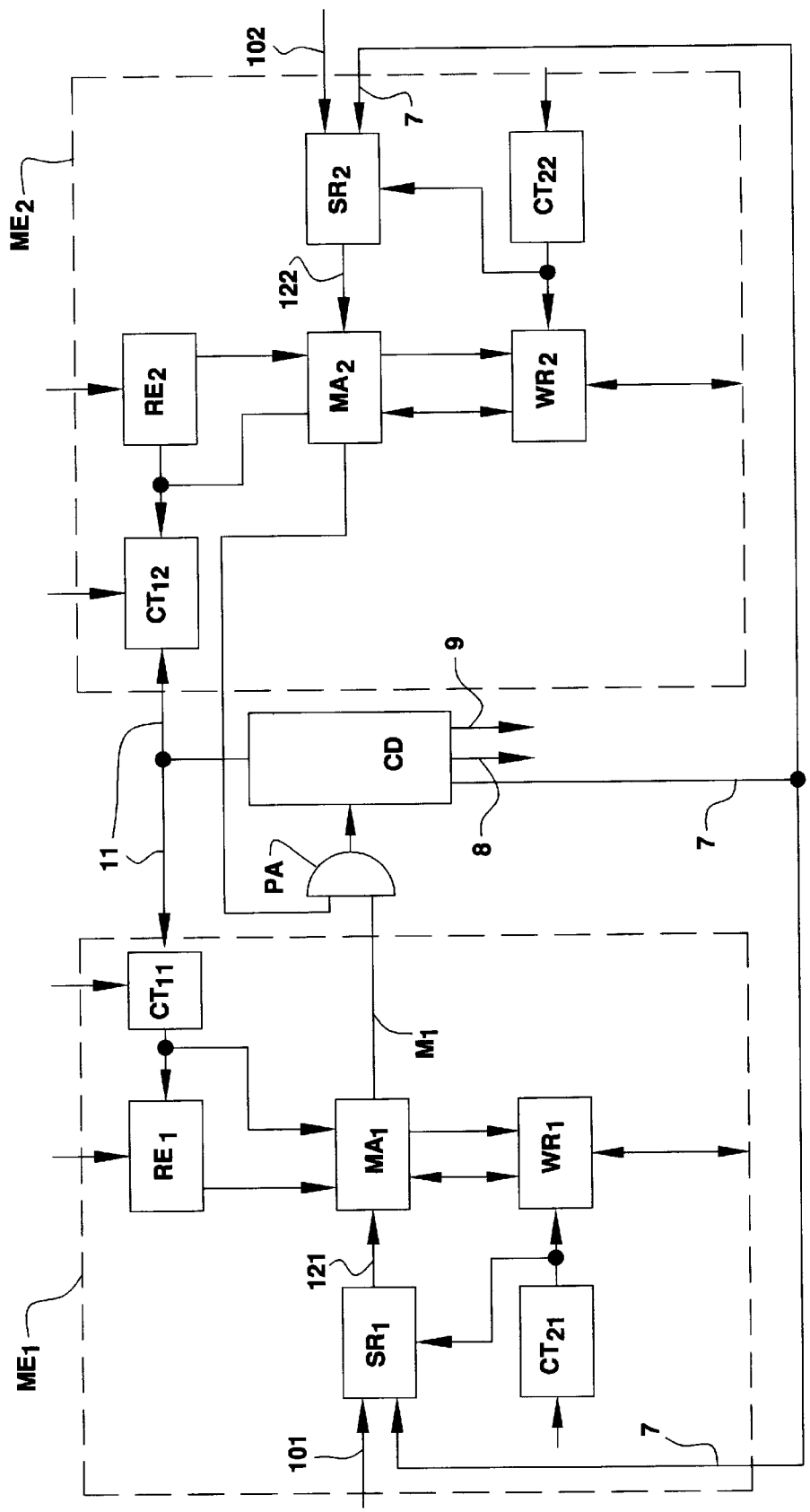
FIG. 4 is a diagram of a memory containing several modules.

Capacity of the memory described in the invention can be expanded to operate on words with $N^1 > N$ Columns. FIG. 4, for instance, illustrates a memory using two ME1, ME2 modules, each identical to the ME module of FIG. 1. The elements corresponding to those of FIG. 1 are shown with the same references, plus the addition of a 1 and 2 respectively. For simplicity, the drawing does not show the corresponding circuits of CT3 (incorporated into WR1, WR) and MX, nor has the direct address of matrix MA1, MA2 dummy line been separated from the data line one. The two modules are associated to the same CD encoder through a logic network whose inputs are the match lines (the one related to the dummy line included) indicated in the complex with M1 and M2 leaving the two matrices MA1 and MA2 and which executes the AND of signals present on homologous lines. Each of the two registers RE1, RE2 loads and presents part of the comparand to matrices MA1 and MA2. This solution obviously requires that the two matrices have the same number of lines. Conversely, the number of N1 columns of matrix MA1 can differ from the number of N2 columns of matrix MA2.

A memory such as described herein can be designed with system-on-chip technologies, which enable automatic design as any integrated circuit library cell. In case of a reduced capacity memory, such as referred to for matrix MA, one or more ME modules can still be implemented on the same integrated circuit also containing the device using the memory, such as a telecommunications routing management device for Internet for instance. Technicians will obviously appreciate the advantages in terms of time saving for access to the memory, reduced consumption and less system complexity featured by a result of this type.

Based on user system needs, memory configuration can be as required to operate as binary or ternary CAM or RAM and select areas to be used as RAM or CAM.

This description is obviously just an example and variations and modifications can be introduced without leaving the invention protection range.

We claim:

1. Memory addressable through its content, for storing data words whose bits can have a don't care logical value in addition to two complementary values and comprising of:

at least one matrix of memory cells organized to form an array of M data words of N bits each, where each bit stored in a cell of a line of the array is allocated individually to one bit if this bit can only have two complementary logical values or to pairs of the same bit if a logical don't care value condition is admitted for it;

means for presenting the matrix a data word to be searched in the memory by comparing jointly with a mask word the means for presenting connected to matrix cells through presentation lines common to all column cells of the matrix, first comparison means associated to each cell for executing a comparison between a comparand bit and the bit stored in the cell, comparison means outputs being associated to lines cells of the matrix combined with one another to generate the signals indicating positive or negative comparison between the comparand and the word stored in the line on a match line;

encoding means connected to the match lines for emitting signals indicating whether or not a match was found between the comparand and the words stored and in the affirmative whether a match was found with one or more stored words; and control means for controlling access to the matrix for executing comparisons or reading/writing data by direct addressing, the entire array of words stored in the matrix forming a data structure accessible by direct addressing, with an address supplied by a user device or consisting of the signal emitted by the encoding means to indicate that a match was found between the comparand and one stored word;

said matrix includes a supplementary line of cells for storing dummy data organized so that a comparison with a comparand will always give a match on a dummy match line, and a supplementary column of cells not allocated to memory data and including a cell corresponding to said supplementary line, and the encoding means including a supplementary section connected to the supplementary line of the memory matrix for outputting a dummy address signal;

said control means are suitable to always address said supplementary line during direct addressing memory operation, and;

said supplementary memory matrix line forming with the supplementary section of the encoding means and a first unit of the control means a first resetting loop used during memory operation for executing comparison between a comparand and stored data to control said first control unit so as to disable said means for presenting as soon as a comparand and its mask have been presented to the memory matrix and said supplementary line and column forming with a unit to generate a resetting signal belonging to said control means, a second resetting loop used during direct access memory use to control the control means so as to disable an address means and a data reading means as soon as an item is read.

2. Memory defined in claim 1 wherein said encoding means includes a double combinatory network which:

in the presence of a match between the comparand and one stored word, can supply a bit configuration corresponding to the address of the line where a match was found and the complementary configuration on a pair of outputs;

in the presence of a match between the comparand and more than one stored word, can supply non complementary bit configurations on said pair of outputs;

in the absence of matches, can supply two identical configurations where all bits have the same logical value as an output, and second comparison means suitable to execute bit-to-bit comparisons of bits present in said outputs and convert them into a line address, multiple match and mismatch signal respectively.

3. The memory defined in claim 1 wherein said matrix includes a pair of cells for each bit that can have a don't care logical value and the memory is programmed so that the logical values 0, 1 and don't care of bits in this pair of cells are stored respectively with pairs 01, 10, 00 and the logical value 0, 1 and don't care bits of said comparand are supplied to the presentation means as combinations 0x, x0 and xx, x, indicating their don't care logical value, for comparisons between a comparand and such cell pairs.

4. The memory defined in claim 3, wherein the number of bits that can have a don't care logical value can be programmed based on the requirements of a user device.

5. The memory defined in claim 1 which includes several memory matrices, each suitable to store a string of bits of the same data word and associated to its related presentation means, which present the matrix with a corresponding string of bits of a comparand and a mask, and by the fact that said matrices have the same number of lines and that the match lines associated to homologous lines in all matrices are connected to encoding means common to all matrices through a further logical network that combines into one signal indicating positive or negative comparison result the output signals supplied line by line to individual matrices.

6. The memory defined in claim 5, wherein the strings of bits stored in different matrices have different lengths.

7. The memory defined in claim 1 which is implemented as the cell of an integrated circuit cell library that can be incorporated into the same component on which a user device is integrated.

8. The memory defined in claim 1 wherein its configuration is such as to achieve operation as binary, ternary CAM, RAM memory or as a memory involving an area useable as RAM according to the requirements of a user device.

* * * * *